(12) United States Patent
Li

(10) Patent No.: US 12,484,243 B2
(45) Date of Patent: Nov. 25, 2025

(54) DISPLAY PANEL AND METHOD FOR FABRICATING SAME

(71) Applicant: Shenzhen China Star Optoelectronics Semiconductor Display Technology Co., Ltd., Guangdong (CN)

(72) Inventor: Jinming Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 467 days.

(21) Appl. No.: 17/994,031

(22) Filed: Nov. 25, 2022

(65) Prior Publication Data

US 2024/0113204 A1    Apr. 4, 2024

(30) Foreign Application Priority Data

Sep. 29, 2022  (CN) .......................... 202211204611.9

(51) Int. Cl.
*H10D 30/01*    (2025.01)
*H10D 30/67*    (2025.01)

(52) U.S. Cl.
CPC ..... *H10D 30/0321* (2025.01); *H10D 30/6706* (2025.01); *H10D 30/6729* (2025.01); *H10D 30/6743* (2025.01); *H10D 30/6757* (2025.01)

(58) Field of Classification Search
CPC .......... H10D 30/0321; H10D 30/6731; H10D 30/0314; H10D 30/6706; H10D 30/6715; H10D 86/0229; H10D 30/6704
See application file for complete search history.

(56) References Cited

U.S. PATENT DOCUMENTS

2019/0088788 A1*   3/2019   Ban ..................... H10D 30/6715

* cited by examiner

*Primary Examiner* — Wasiul Haider

(57) ABSTRACT

A method for fabricating a display panel includes: forming a plurality of N-type doped amorphous silicon structures on a substrate; forming an amorphous silicon layer covering the N-type doped amorphous silicon structures and the substrate; blue laser annealing the amorphous silicon layer and the N-type doped amorphous silicon structures, so that the N-type doped amorphous silicon structures are converted into N-type heavily doped polysilicon structures, a part of the amorphous silicon layer in contact with one of the N-type doped amorphous silicon structures and located between two adjacent N-type doped amorphous silicon structures is converted into an N-type lightly doped polysilicon structure, and other parts of the amorphous silicon layer are converted into a polysilicon layer; and patterning the polysilicon layer to form a semiconductor layer.

10 Claims, 9 Drawing Sheets

DISPLAY PANEL AND METHOD FOR FABRICATING SAME

RELATED APPLICATION

This application claims the benefit of priority of Chinese Patent Application No. 202211204611.9 filed on Sep. 29, 2022, the contents of which are incorporated by reference as if fully set forth herein in their entirety.

FIELD OF INVENTION

The present disclosure relates to the technical field of display, and particularly to a display panel and a method for fabricating the same.

BACKGROUND

Thin film transistors (TFTs) are basic circuit components that control brightness of each pixel in a liquid crystal display panel, and are generally made of amorphous silicon material. With the advancement of technology, TFTs increasingly use low temperature polysilicon structures, which greatly improve electrical properties of TFTs.

When a thin film transistor is formed by low temperature polysilicon (LTPS) technology, generally, a standard low temperature polysilicon thin film transistor has two N-type heavily doped regions on a polysilicon layer as a source electrode and a drain electrode. Because a doping concentration of the two N-type heavily doped regions is relatively high, and a distance between the two N-type heavily doped regions and a gate electrode is relatively small, an electric field near the drain electrode is too strong, resulting in a hot carrier effect. As a result, the low temperature polysilicon thin film transistor will have a leakage current in an off state, thereby seriously affecting a stability of the low temperature polysilicon thin film transistor.

In the above, a current display panel has a problem of leakage current. Therefore, it is necessary to provide a display panel and a method for fabricating the same to improve this defect.

SUMMARY OF DISCLOSURE

The present disclosure provides a display panel and a method for fabricating the same to solve a problem that a polysilicon thin film transistor has a leakage current in an off state, thereby increasing a stability of the polysilicon thin film transistor.

The present disclosure provides a method for fabricating a display panel, which comprises:
  forming a plurality of N-type doped amorphous silicon structures on a substrate;
  forming an amorphous silicon layer covering the N-type doped amorphous silicon structures and the substrate;
  blue laser annealing the amorphous silicon layer and the N-type doped amorphous silicon structures, so that the N-type doped amorphous silicon structures are converted into N-type heavily doped polysilicon structures, a part of the amorphous silicon layer in contact with one of the N-type doped amorphous silicon structures and located between two adjacent N-type doped amorphous silicon structures is converted into an N-type lightly doped polysilicon structure, and other parts of the amorphous silicon layer are converted into a polysilicon layer; and
  patterning the polysilicon layer to form a semiconductor layer.

In an embodiment, the N-type doped amorphous silicon structures comprise a first N-type doped amorphous silicon structure and a second N-type doped amorphous silicon structure. In the blue laser annealing the amorphous silicon layer and the N-type doped amorphous silicon structures, a laser scanning direction is a direction from the first N-type doped amorphous silicon structure to the second N-type doped amorphous silicon structure.

In an embodiment, a part of the amorphous silicon layer located on a side of the first N-type doped amorphous silicon structure close to the second N-type doped amorphous silicon structure and in contact with the first N-type doped amorphous silicon structure is converted into the N-type lightly doped polysilicon structure.

In an embodiment, the first N-doped amorphous silicon structure is converted into a first N-type heavily doped polysilicon structure. The second N-type doped amorphous silicon structure is converted into a second N-type doped polysilicon structure. The semiconductor layer comprises a channel portion located between the N-type lightly doped polysilicon structure and the second N-type heavily doped polysilicon structure, and the channel portion is in contact with the N-type lightly doped polysilicon structure and the second N-type heavily doped polysilicon structure.

In an embodiment, each of the N-type doped amorphous silicon structures has an inclined sidewall and a bottom surface connected to the inclined sidewall and lying flat on the substrate, and an angle between the inclined sidewall and the bottom surface is less than 45°.

In an embodiment, a length of an orthographic projection of the inclined sidewall on the bottom surface is greater than or equal to 0.5 μm and less than or equal to 2 μm.

In an embodiment, the method for fabricating the display panel further comprises:
  forming a gate insulating layer on the semiconductor layer;
  forming a gate metal layer on the gate insulating layer, and patterning the gate metal layer to form a gate electrode;
  forming an interlayer dielectric layer on the gate electrode;
  forming a plurality of via holes penetrating through the interlayer dielectric layer, the gate insulating layer, and the semiconductor layer, and exposing the first N-type heavily doped polysilicon structure and the second N-type heavily doped polysilicon structure; and
  forming a source-drain electrode layer on the interlayer dielectric layer, and patterning the source-drain electrode layer to form a source electrode and a drain electrode, wherein the drain electrode is in contact with the first N-type heavily doped polysilicon structure through one of the via holes, and the source electrode is in contact with the second N-type heavily doped polysilicon structure through another via hole.

In an embodiment, an orthographic projection of the first N-type heavily doped polysilicon structure on the substrate does not overlap with an orthographic projection of the gate electrode on the substrate, and an orthographic projection of the N-type lightly doped polysilicon structure on the substrate partially overlaps the orthographic projection of the gate electrode on the substrate.

In an embodiment, a distance between the orthographic projection of the first N-type heavily doped polysilicon structure on the substrate and the orthographic projection of the gate electrode on the substrate is 1 μm to 3 μm, a length of the N-type lightly doped polysilicon structure is 1 μm to 4 μm, and a length of an overlapping portion of the orthographic projection of the N-type lightly doped polysilicon structure on the substrate and the orthographic projection of the gate electrode on the substrate is greater than 0 μm and less than or equal to 1 μm.

In an embodiment, in the blue laser annealing the amorphous silicon layer and the N-type doped amorphous silicon structures, crystallization energy is greater than or equal to 700 mA and less than or equal to 1200 mA.

The present disclosure further provides a display panel, which comprises a substrate, a plurality of N-type heavily doped polysilicon structures, an N-type lightly doped polysilicon structure, and a semiconductor layer. The N-type heavily doped polysilicon structures are disposed on the substrate. The N-type lightly doped polysilicon structure is disposed on the substrate, is located between two adjacent N-type heavily doped polysilicon structures, and is in contact with one of the N-type heavily doped polysilicon structures. The semiconductor layer covers the two adjacent N-type heavily doped polysilicon structures and the N-type lightly doped polysilicon structure located between the two adjacent N-type heavily doped polysilicon structures.

In an embodiment, the display panel further comprises a source electrode and a drain electrode. The N-type heavily doped polysilicon structures comprise a first N-type heavily doped polysilicon structure and a second N-type heavily doped polysilicon structure. The drain electrode is electrically connected to the first N-type heavily doped polysilicon structure. The source electrode is electrically connected to the second N-type heavily doped polysilicon structure. The N-type lightly doped polysilicon structure is disposed on a side of the first N-type heavily doped polysilicon structure close to the second N-type heavily doped polysilicon structure and is in contact with the first N-type heavily doped polysilicon structure.

In an embodiment, the semiconductor layer comprises a channel portion disposed between the N-type lightly doped polysilicon structure and the second N-type heavily doped polysilicon structure and in contact with the N-type lightly doped polysilicon structure and the second N-type heavily doped polysilicon structure.

In an embodiment, the display panel further comprises a gate electrode disposed on a side of the semiconductor layer away from the substrate. An orthographic projection of the first N-type heavily doped polysilicon structure on the substrate does not overlap with an orthographic projection of the gate electrode on the substrate. An orthographic projection of the N-type lightly doped polysilicon structure on the substrate partially overlaps the orthographic projection of the gate electrode on the substrate.

In an embodiment, a distance between the orthographic projection of the first N-type heavily doped polysilicon structure on the substrate and the orthographic projection of the gate electrode on the substrate is 1 μm to 3 μm, a length of the N-type lightly doped polysilicon structure is 1 μm to 4 μm, and a length of an overlapping portion of the orthographic projection of the N-type lightly doped polysilicon structure on the substrate and the orthographic projection of the gate electrode on the substrate is greater than 0 μm and less than or equal to 1 μm.

In an embodiment, the display panel further comprises a gate insulating layer and an interlayer dielectric layer stacked on the semiconductor layer, and a plurality of via holes. The source electrode and the drain electrode are disposed on a side of the interlayer dielectric layer away from the substrate. The via holes penetrate through the interlayer dielectric layer, the gate insulating layer, and the semiconductor layer, and expose the first N-type heavily doped polysilicon structure and the second N-type heavily doped polysilicon structure. The drain electrode is in contact with the first N-type heavily doped polysilicon structure through one of the via holes, and the source electrode is in contact with the second N-type heavily doped polysilicon structure through another via hole.

Beneficial effects of the present disclosure are as follows. The present disclosure provides a display panel and a method for fabricating the same. The method comprises: forming a plurality of N-type doped amorphous silicon structures on a substrate; forming an amorphous silicon layer covering the N-type doped amorphous silicon structures and the substrate; blue laser annealing the amorphous silicon layer and the N-type doped amorphous silicon structures, so that the N-type doped amorphous silicon structures are converted into N-type heavily doped polysilicon structures, a part of the amorphous silicon layer in contact with one of the N-type doped amorphous silicon structures and located between two adjacent N-type doped amorphous silicon structures is converted into an N-type lightly doped polysilicon structure, and other parts of the amorphous silicon layer are converted into a polysilicon layer; and patterning the polysilicon layer to form a semiconductor layer. In this way, a resistance between two adjacent N-type heavily doped polysilicon structures respectively connected to a source electrode and a drain electrode has a gradient from high to low, which increases a resistance between the source electrode and the drain electrode and reduces a leakage current flowing from the source electrode to the drain electrode, thereby improving the problem that a polysilicon thin film transistor has a leakage current in an off state and increasing a stability of the polysilicon thin film transistor.

BRIEF DESCRIPTION OF DRAWINGS

In order to more clearly illustrate technical solutions in embodiments of the present disclosure or the prior art, a brief description of accompanying drawings used in the embodiments or the prior art will be given below. The accompanying drawings in the following description are merely some embodiments of the present disclosure. For those skilled in the art, other drawings may be obtained from these accompanying drawings without creative labor.

DETAILED DESCRIPTION

Figure 1:
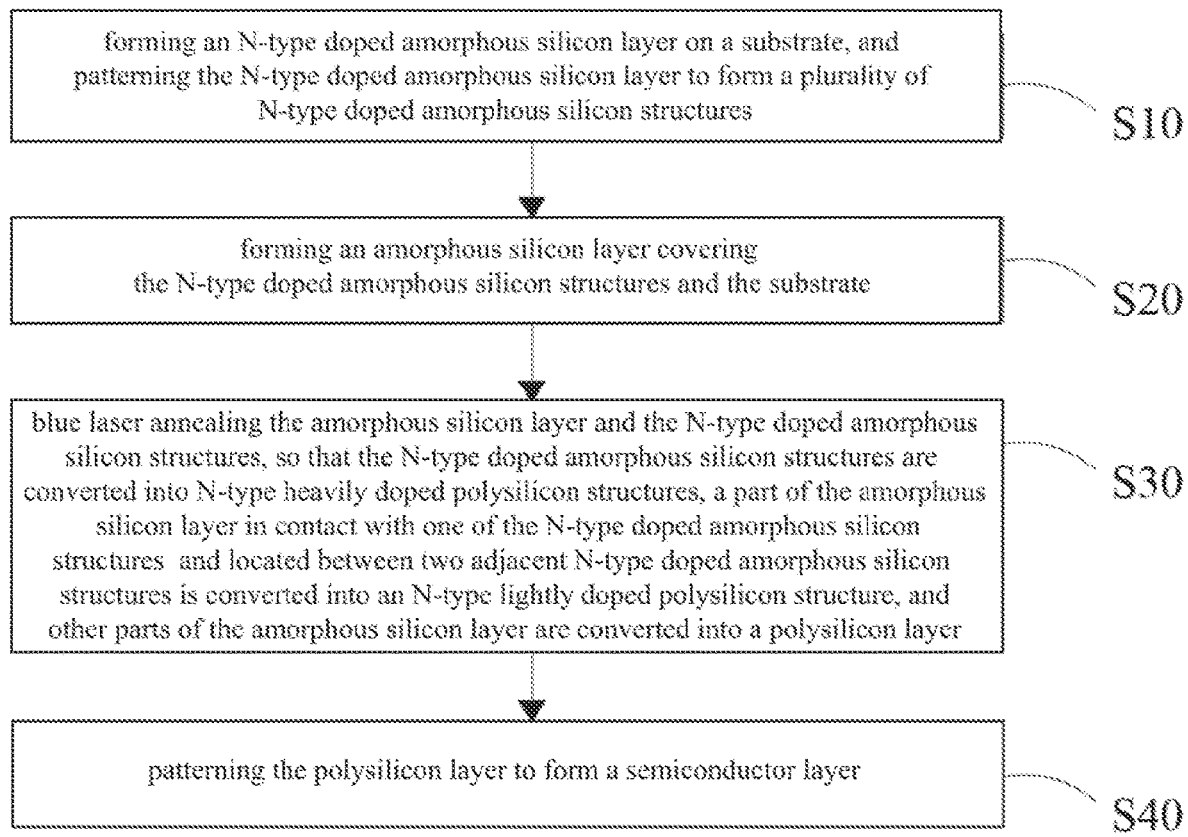
FIG. 1 is a schematic flowchart of a method for fabricating a display panel according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

The present disclosure will be further described in detail below in combination with accompanying drawings and specific embodiments.

The present disclosure provides a method for fabricating a display panel. Please refer to FIG. 1 and FIG. 2a to FIG. 2j. FIG. 1 is a schematic flowchart of a method for fabricating a display panel according to an embodiment of the present disclosure. FIG. 2a to FIG. 2j are schematic structural diagrams of a method for fabricating a display panel according to an embodiment of the present disclosure. The method for fabricating the display panel comprises the following steps.

Figure 2A:
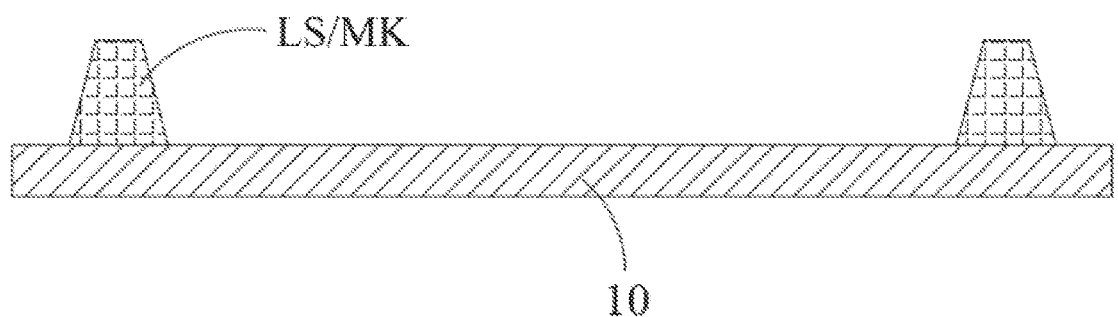
FIG. 2a to FIG. 2j are schematic structural diagrams of a method for fabricating a display panel according to an embodiment of the present disclosure.
Figure 2B:
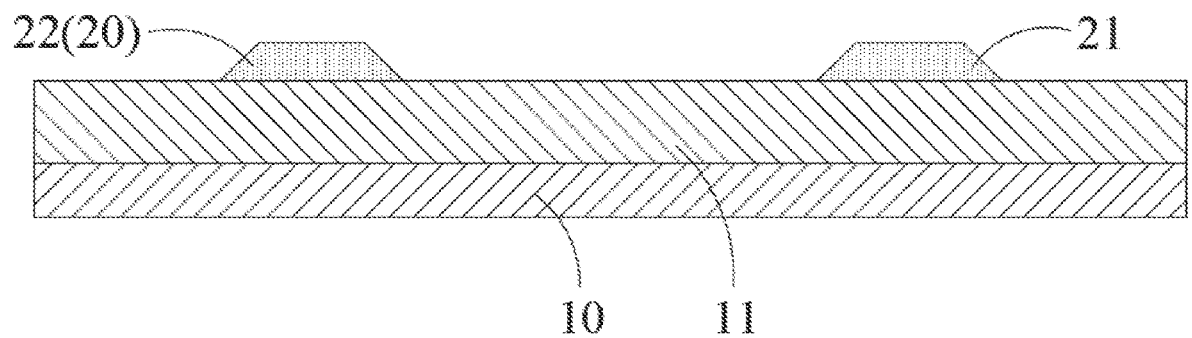

Step S10: please refer to FIG. 2b, forming an N-type doped amorphous silicon layer on a substrate 10, and patterning the N-type doped amorphous silicon layer to form a plurality of N-type doped amorphous silicon structures 20.

In this embodiment, please refer to FIG. 2a, before forming the N-type doped amorphous silicon layer on the substrate 10, a light shielding layer may be formed by physical vapor deposition (PVD), and then the light shielding layer is patterned to form a light-shielding pattern LS or an alignment mark MK with a pattern.

The light shielding layer may have a thickness greater than or equal to 2000 angstroms and less than or equal to 5500 angstroms. For example, the thickness of the light shielding layer may be, but is not limited to, 2000 angstroms, 2500 angstroms, 3000 angstroms, 3500 angstroms, 4000 angstroms, 4500 angstroms, 5000 angstroms, or 5500 angstroms.

The light shielding layer may be a composite metal layer formed by stacking two or more metal layers. For example, the light shielding layer may be a double-layer metal structure formed by stacking molybdenum (Mo) and aluminum (Al). In some other embodiments, the light shielding layer may also be made of other metals or alloys with higher reflectivity.

Furthermore, after forming the light shielding layer, a buffer layer 11 may be formed on the light shielding layer by plasma enhanced chemical vapor deposition, as shown in FIG. 2b. The buffer layer 11 may be a single-layer structure or a multi-layer composite structure formed of inorganic materials.

For example, the buffer layer 11 may be a single-layer structure made of silicon oxide (SiOx), or may be a double-layer composite structure formed by stacking silicon nitride (SiNx) and silicon oxide.

Furthermore, the buffer layer 11 has a thickness greater than or equal to 1500 angstroms and less than or equal to 4000 angstroms. For example, the thickness of the buffer layer 11 may be, but is not limited to, 1500 angstroms, 2000 angstroms, 2500 angstroms, 3000 angstroms, 3500 angstroms, or 4000 angstroms.

In step S10, the N-type doped amorphous silicon layer may be formed by chemical vapor deposition (CVD) and may be doped with phosphorus ions.

The N-type doped amorphous silicon layer may have a thickness greater than or equal to 400 angstroms and less than or equal to 1000 angstroms. For example, the thickness of the N-type doped amorphous silicon layer may be, but is not limited to, 400 angstroms, 600 angstroms, 700 angstroms, 800 angstroms, or 1000 angstroms.

After the N-type doped amorphous silicon layer is formed by deposition, the N-type doped amorphous silicon layer may be patterned using a yellow light process and an etching process in sequence to form the plurality of N-type doped amorphous silicon structures 20.

Figure 2C:
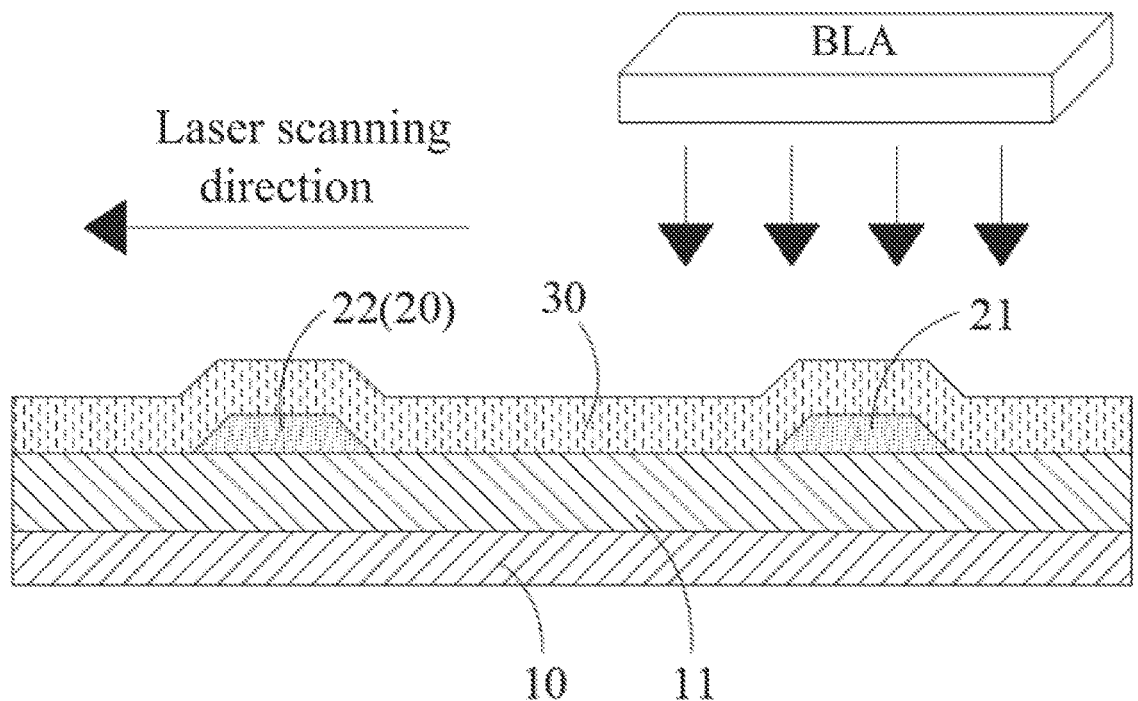

Step S20: please refer to FIG. 2c, forming an amorphous silicon layer 30 covering the N-type doped amorphous silicon structures 20 and the substrate 10.

As shown in FIG. 2c, the amorphous silicon layer 30 may be formed by chemical vapor deposition, then annealed, and finally dehydrogenated. An annealing temperature may be greater than or equal to 450° C. and less than or equal to 600° C. An annealing time may be greater than or equal to 0.5 hours and less than or equal to 2 hours. A hydrogen content of the amorphous silicon layer 30 after dehydrogenation may be less than 0.5%.

Specifically, the amorphous silicon layer 30 may be composed of amorphous silicon (a-Si) with low hydrogen (H) content.

Figure 2D:
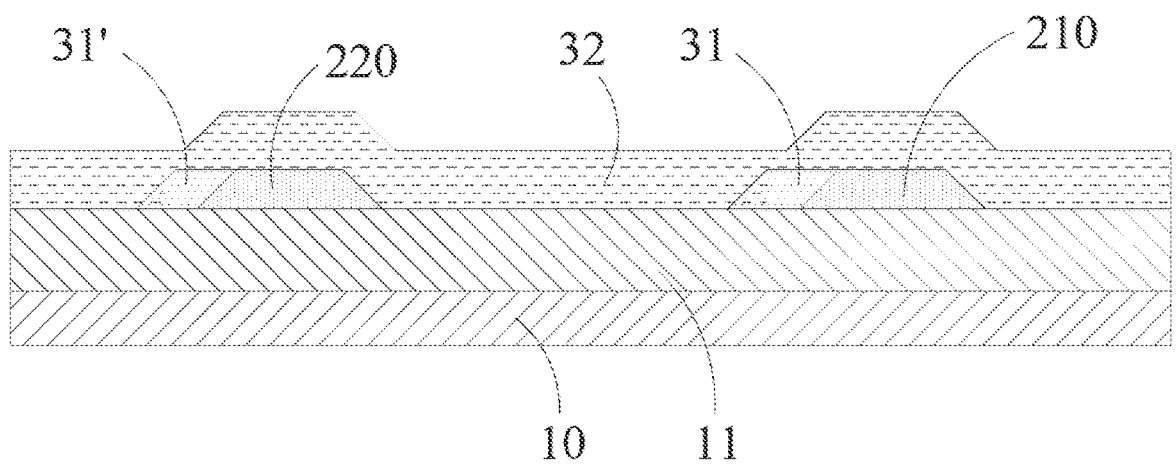

Step S30: please refer to FIG. 2c and FIG. 2d, blue laser annealing (BLA) the amorphous silicon layer 30 and the N-type doped amorphous silicon structures 20, so that the N-type doped amorphous silicon structures 20 are converted into N-type heavily doped polysilicon structures, a part of the amorphous silicon layer 30 in contact with one of the N-type doped amorphous silicon structures 20 and located between two adjacent N-type doped amorphous silicon structures 20 is converted into an N-type lightly doped polysilicon structure 31, and other parts of the amorphous silicon layer are converted into a polysilicon layer 32.

In this embodiment, as shown in FIG. 2c, the N-type doped amorphous silicon structures 20 may comprise a first N-type doped amorphous silicon structure 21 and a second N-type doped amorphous silicon structure 22. The display panel may comprise a source electrode and a drain electrode. The drain electrode may be electrically connected to the corresponding first N-type doped amorphous silicon structure 21, and the source electrode may be electrically connected to the corresponding second N-type doped amorphous silicon structure 22.

In step S30, a laser scanning direction is a direction from the drain electrode to the source electrode, and a laser emission direction is toward the amorphous silicon layer 30 and the N-type doped amorphous silicon structure 20. Because the direction from the drain electrode to the source electrode is same as a direction from the first N-type doped amorphous silicon structure 21 to the second N-type doped amorphous silicon structure 22, the laser scanning direction may be the direction from the first N-type doped amorphous silicon structure 21 to the second N-type doped amorphous silicon structure 22.

As shown in FIG. 2c and FIG. 2d, along the laser scanning direction, the amorphous silicon layer 30 and the N-type doped amorphous silicon structures 20 are annealed by blue laser, so that the first N-type doped amorphous silicon structure 21 is transformed into the first N-type heavily doped polysilicon structure 210, and the second N-type doped amorphous silicon structure 22 is transformed into a second N-type heavily doped polysilicon structure 220.

It should be noted that in the blue laser annealing, a diffusion direction of phosphorus ions in the first N-type doped amorphous silicon structure 21 and the second N-type doped amorphous silicon structure 22 is same as the laser scanning direction.

Because the laser scanning direction is the direction from the first N-type doped amorphous silicon structure 21 to the second N-type doped amorphous silicon structure 22, the phosphorus ions in the first N-type doped amorphous silicon structure 21 diffuse to a part of the amorphous silicon layer 30 located on a side of the first N-type doped amorphous silicon structure 21 close to the second N-type doped amorphous silicon structure 22 and in contact with the first N-type doped amorphous silicon structure 21, so that the part of the amorphous silicon layer 30 is doped during crystallization, and has a doping concentration less than a doping concentration of the first N-type doped amorphous silicon structure 21. Thus, the part of the amorphous silicon layer 30 is transformed into the N-type lightly doped polysilicon structure 31. Other parts of the amorphous silicon layer 30 are transformed into the polysilicon layer 32.

It should be noted that based on the same principle as above, a part of the amorphous silicon layer 30 located on a side of the second N-type doped amorphous silicon structure 22 away from the first N-type doped amorphous silicon structure 21 and in contact with the second N-type doped amorphous silicon structure 22 will also be doped and transformed into an invalid N-type lightly doped polysilicon structure 31'. Because the invalid N-type lightly doped polysilicon structure 31' is not located between the first N-type heavily doped polysilicon structure 210 and the second N-type heavily doped polysilicon structure 220, the inactive N-type lightly doped polysilicon structure 31' does not affect electrical performance of a thin film transistor.

Furthermore, in step S30, crystallization energy required for the blue laser annealing should be greater than or equal to 700 mA and less than or equal to 1200 mA, which can ensure both the amorphous silicon layer 30 and the underlying N-type doped amorphous silicon structures 20 can crystallize laterally. For example, the crystallization energy may be, but is not limited to, 700 mA, 850 mA, 900 mA, 1000 mA, or 1200 mA.

Crystals formed by current excimer laser annealing (ELA) are vertical crystals with small electron mobility. Crystals formed by blue laser annealing are lateral crystals, their crystal grain size can reach more than 4 µm, and their electron mobility can reach more than 400 cm$^2$/(V s). Therefore, crystallizing the amorphous silicon layer 30 and the N-type doped amorphous silicon structures 20 by blue laser annealing can effectively improve electron mobility.

Figure 2E:
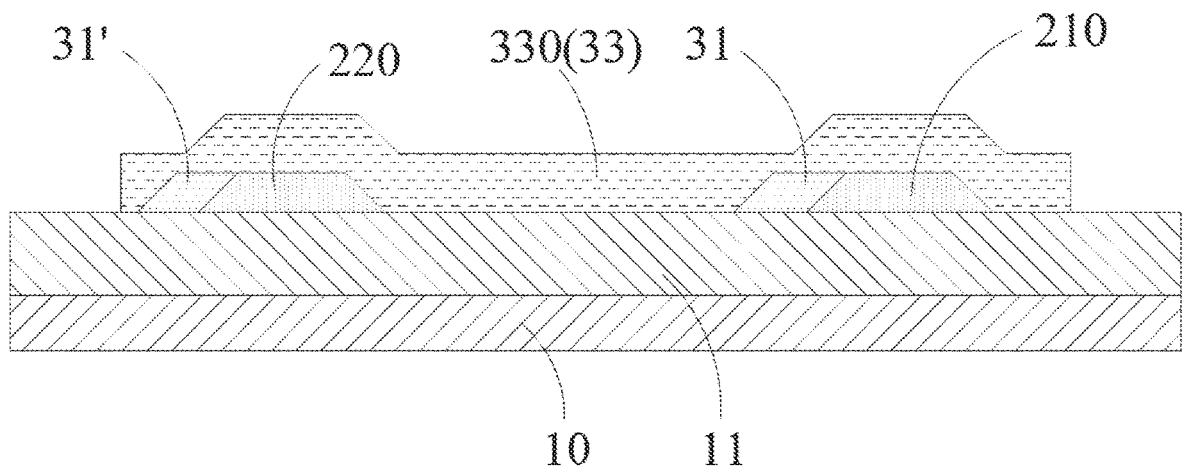

Step S40: please refer to FIG. 2e, patterning the polysilicon layer 32 to form a semiconductor layer 33.

In step S40, the polysilicon layer 32 may be patterned using a yellow light process and an etching process in sequence to form the patterned semiconductor layer 33.

As shown in FIG. 2e, the semiconductor layer 33 covers the first N-type heavily doped polysilicon structure 210, the second N-type heavily doped polysilicon structure 220, and the N-type lightly doped polysilicon structure 31.

The semiconductor layer 33 may comprise a channel portion 330. The channel portion 330 is located between the N-type lightly doped polysilicon structure 31 and the second N-type heavily doped polysilicon structure 220, and is connected to the N-type lightly doped polysilicon structure 31 and the second N-type lightly doped polysilicon structure 31.

In this embodiment, a doping concentration of the N-type lightly doped polysilicon structure 31 is less than a doping concentration of the first N-type heavily doped polysilicon structure 210, and the channel portion 330 is an intrinsic undoped semiconductor. Therefore, a resistance of the channel portion 330 is greater than a resistance of the N-type lightly doped polysilicon structure 31, and the resistance of the N-type lightly doped polysilicon structure 31 is greater than a resistance of the first N-type heavily doped polysilicon structure 210. Thus, a resistance from the channel portion 330 to the first N-type heavily doped polysilicon structure 210 is gradually reduced. Because the resistance of the N-type lightly doped polysilicon structure 31 is greater than the resistance of the first N-type heavily doped polysilicon structure 210, adding the N-type lightly doped polysilicon structure 31 between the first N-type heavily doped polysilicon structure 210 and the channel portion 330 increases a resistance between the source electrode and the drain electrode. In this way, a leakage current flowing from the source electrode to the drain electrode is reduced, thereby improving the problem that a polysilicon thin film transistor has a leakage current in an off state and increasing a stability of the polysilicon thin film transistor.

Figure 3:
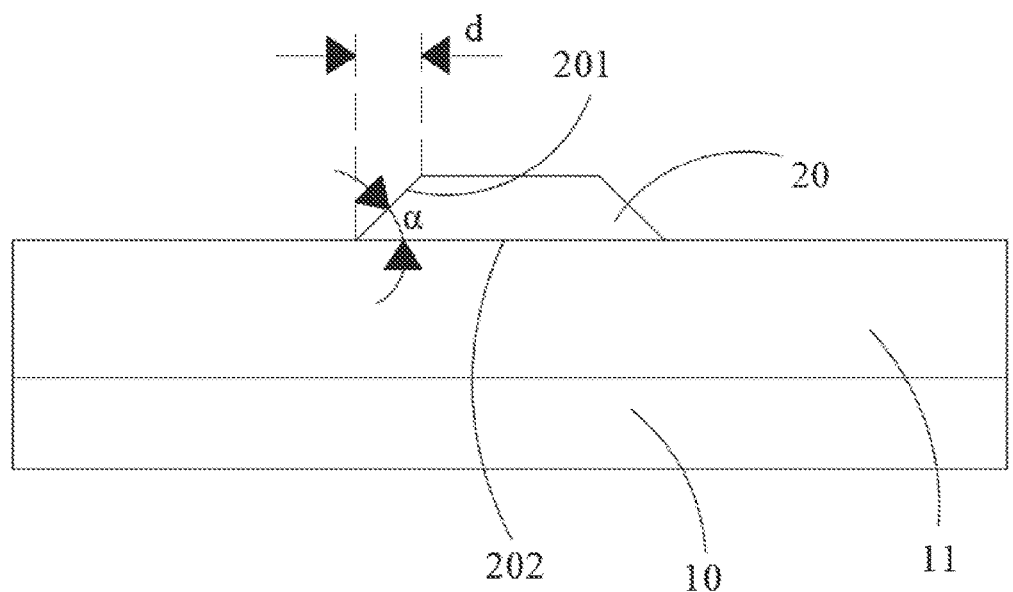
FIG. 3 is a schematic structural diagram of an N-type doped amorphous silicon structure according to an embodiment of the present disclosure.

Furthermore, please refer to FIG. 3, which is a schematic structural diagram of the N-type doped amorphous silicon structure 20 according to an embodiment of the present disclosure. The N-type doped amorphous silicon structure 20 has an inclined sidewall 201 and a bottom surface 202 connected to the inclined sidewall 201 and lying flat on the substrate 10, and an angle α between the inclined sidewall 201 and the bottom surface 202 is less than 45°.

For example, the angle α between the inclined sidewall 201 and the bottom surface 202 may be, but is not limited to, 45°, 30°, 25°, or 10°.

A length d of an orthographic projection of the inclined sidewall 201 on the bottom surface 202 in the laser scanning direction is greater than or equal to 0.5 µm and less than or equal to 2 µm.

For example, the length d of the orthographic projection of the inclined sidewall 201 on the bottom surface 202 in the laser scanning direction may be, but is not limited to, 0.5 µm, 0.8 µm, 1 µm, 1.25 µm, 1.5 µm, 1.8 µm, or 2 microns.

It should be noted that the angle α between the inclined sidewall 201 and the bottom surface 202 and the length d of the orthographic projection of the inclined sidewall 201 on the bottom surface 202 are all related to a concentration of phosphorus ions diffused during blue laser annealing. The angle α between the inclined sidewall 201 and the bottom surface 202 is limited within 45°, and the length d of the orthographic projection of the inclined side wall 201 on the bottom surface 202 in the laser scanning direction is limited between 0.5 and 2 µm, so as to ensure that during blue laser annealing, a concentration gradient of phosphorus ions is formed between the first N-type heavily doped polysilicon structure 210 and the N-type lightly doped polysilicon structure 31. Therefore, the resistance from the channel portion 330 to the first N-type heavily doped polysilicon structure 210 is gradually decreased, thereby increasing a resistance between the first N-type heavily doped polysilicon structure 210 and the second N-type heavily doped polysilicon structure 220.

Furthermore, the method for fabricating the display panel further comprises the following steps.

Figure 2F:
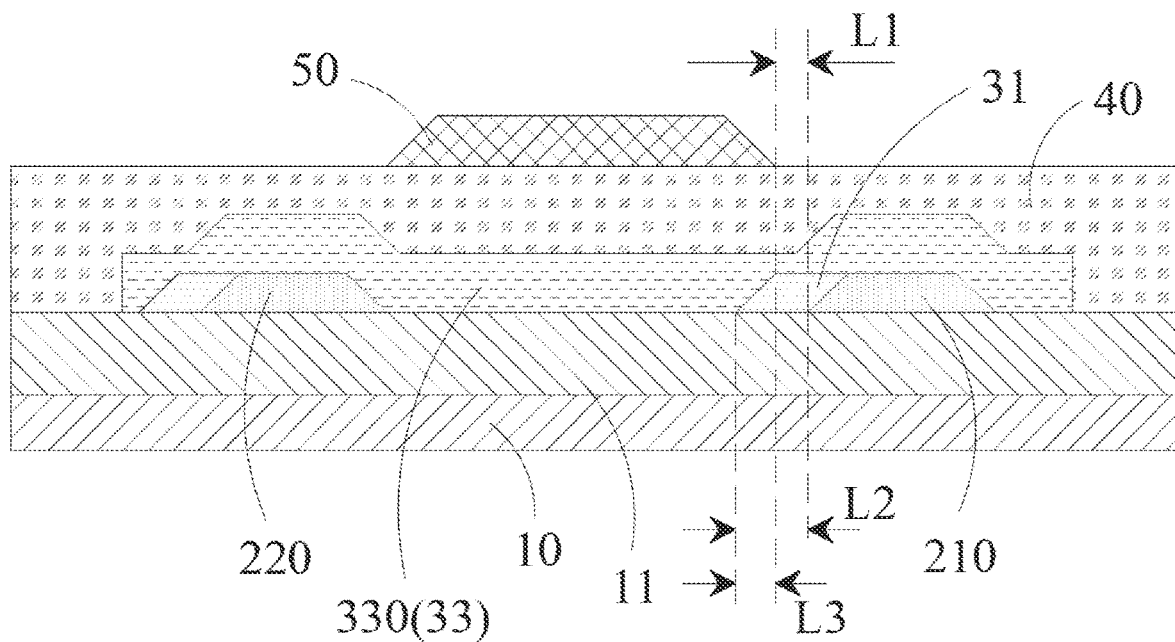

Step S50: please refer to FIG. 2f, forming a gate insulating layer 40 on the semiconductor layer 33.

In step S50, the gate insulating layer 40 may be formed using plasma enhanced chemical vapor deposition.

As shown in FIG. 2f, the gate insulating layer 40 may be a single-layer structure made of silicon oxide (SiOx), or may be a composite layer formed by stacking silicon nitride (SiNx) and silicon oxide.

The gate insulating layer 40 may have a thickness greater than or equal to 1000 angstroms and less than or equal to 2000 angstroms. For example, the thickness of the gate insulating layer 40 may be, but is not limited to, 1000 angstroms, 1200 angstroms, 1400 angstroms, 1500 angstroms, 1600 angstroms, 1800 angstroms, or 2000 angstroms.

Step S60: please refer to FIG. 2f, forming a gate metal layer on the gate insulating layer 40, and patterning the gate metal layer to form a gate electrode 50.

As shown in FIG. 2f, the gate metal layer may be formed on the gate insulating layer 40 by physical vapor deposition, and then the gate metal layer may be patterned by a yellow light process and an etching process in sequence to form the gate electrode 50.

In an embodiment, the gate electrode 50 disposed corresponding to the channel portion 330. An orthographic projection of the gate electrode 50 on the substrate 10 overlaps with an orthographic projection of the channel portion 330 on the substrate 10. The orthographic projection of the gate electrode 50 on the substrate 10 does not overlap orthographic projections of the first N-type heavily doped polysilicon structure 210 and the second N-type heavily doped polysilicon structure 220 on the substrate 10.

In an embodiment, as shown in FIG. 2f, the orthographic projection of the gate electrode 50 on the substrate 10 covers the orthographic projection of the channel portion 330 on the substrate 10. The orthographic projection of the gate electrode 50 on the substrate 10 does not overlap with the orthographic projection of the first N-type heavily doped polysilicon structure 210 on the substrate 10. The orthographic projection of the gate electrode 50 on the substrate 10 partially overlaps an orthographic projection of the N-type lightly doped polysilicon structure 31 on the substrate 10.

It should be noted that when forming the first N-type heavily doped polysilicon structure 210 and the second N-type heavily doped polysilicon structure 220, the first N-type heavily doped polysilicon structure 210 and the second N-type heavily doped polysilicon structure 220 have been doped with phosphorus ions. Therefore, the first N-type heavily doped polysilicon structure 210, the second N-type heavily doped polysilicon structure 220, and the N-type lightly doped polysilicon structure 31 need not be doped with shielding of the gate electrode 50 at the channel portion 330. Due to limitation of process accuracy, it is impossible to accurately control the orthographic projection of the gate electrode 50 on the substrate 10 to cover the orthographic projection of the channel portion 330 on the substrate 10, so the gate electrode 50 may be offset from the channel portion 330. If the gate electrode 50 and the channel portion 330 are offset, when the gate electrode 50 receives a signal, an region of the channel portion 330 not covered by the gate electrode 50 may not be controlled by the gate electrode 50, and a resistance of the region is greater than a resistance of a region of the channel portion 330 covered by the gate electrode 50, so that a mobility of the channel portion 330 is reduced. By making the orthographic projection of the gate electrode 50 on the substrate 10 partially overlap with the orthographic projection of the N-type lightly doped polysilicon structure 31 on the substrate 10, even if the gate electrode 50 is offset from the channel portion 330, the orthographic projection of the gate electrode 50 on the substrate 10 can completely cover the orthographic projection of the channel portion 330 on the substrate 10. This ensures that the gate electrode 50 can control the channel portion 330, and avoids a problem that the mobility of the channel portion 330 is reduced due to the offset between the gate electrode 50 and the channel portion 330.

Furthermore, a distance L1 between the orthographic projection of the first N-type heavily doped polysilicon structure 210 on the substrate 10 and the orthographic projection of the gate electrode 50 on the substrate 10 is 1 μm to 3 μm, a length L2 of the N-type lightly doped polysilicon structure 31 is 1 μm to 4 μm, and a length L3 of an overlapping portion of the orthographic projection of the N-type lightly doped polysilicon structure 31 on the substrate 10 and the orthographic projection of the gate electrode 50 on the substrate 10 is greater than 0 μm and less than or equal to 1 μm.

The length L2 of the N-type lightly doped polysilicon structure 31 is related to the angle α of the inclined sidewall 201 of the N-type doped amorphous silicon structure 20, and the length d of the orthographic projection of the inclined sidewall 201 on the bottom surface 202 in the laser scanning direction. When the angle α between the inclined sidewall 201 and the bottom surface 202 is less than 45°, and the length d of the orthographic projection of the inclined sidewall 201 on the bottom surface 202 in the laser scanning direction is 0.5 μm to 2 μm, the length L2 of the N-type lightly doped polysilicon structure 31 in the laser scanning direction may be between 1 and 4 μm. For example, the length L2 of the N-type lightly doped polysilicon structure 31 in the laser scanning direction may be, but is not limited to, 1 μm, 2 μm, 2.5 μm, 3 μm, or 4 μm.

In an embodiment, the distance L1 between the orthographic projection of the first N-type heavily doped polysilicon structure 210 on the substrate 10 and the orthographic projection of the gate electrode 50 on the substrate 10 is 1 μm, the length L2 of the N-type lightly doped polysilicon structure 31 is 1.1 μm, and the length L3 of the overlapping portion of the orthographic projection of the N-type lightly doped polysilicon structure 31 on the substrate 10 and the orthographic projection of the gate electrode 50 on the substrate 10 is 0.1 μm.

In an embodiment, the distance L1 between the orthographic projection of the first N-type heavily doped polysilicon structure 210 on the substrate 10 and the orthographic projection of the gate electrode 50 on the substrate 10 is 1.5 μm, the length L2 of the N-type lightly doped polysilicon structure 31 is 2 μm, and the length L3 of the overlapping portion of the orthographic projection of the N-type lightly doped polysilicon structure 31 on the substrate 10 and the orthographic projection of the gate electrode 50 on the substrate 10 is 0.5 μm.

In an embodiment, the distance L1 between the orthographic projection of the first N-type heavily doped polysilicon structure 210 on the substrate 10 and the orthographic projection of the gate electrode 50 on the substrate 10 is 3 μm, the length L2 of the N-type lightly doped polysilicon structure 31 is 4 μm, and the length L3 of the overlapping portion of the orthographic projection of the N-type lightly doped polysilicon structure 31 on the substrate 10 and the orthographic projection of the gate electrode 50 on the substrate 10 is 1 μm.

It should be noted that in order to ensure the gate electrode 50 can control the channel portion 330, the length L3 of the overlapping portion of the orthographic projection of the N-type lightly doped polysilicon structure 31 on the substrate 10 and the orthographic projection of the gate electrode 50 on the substrate 10 should be greater than 0 μm, and the length L3 of the overlapping portion of the orthographic projection of the N-type lightly doped polysilicon structure 31 on the substrate 10 and the orthographic projection of the gate electrode 50 on the substrate 10 should not be greater than 1 μm. In this way, it can be avoided that the N-type lightly doped polysilicon structure 31 compresses the length of the channel portion 330, thereby preventing the leakage current from increasing due to a short channel effect being exacerbated because a channel length of the channel portion 330 is too short. In an embodiment, an orthographic projection of the second N-type heavily doped polysilicon structure 220 on the substrate 10 partially overlaps the orthographic projection of the gate electrode 50 on the substrate 10.

It should be noted that there is no lightly doped structure between the second N-type heavily doped polysilicon structure 220 and the channel portion 330, and the second N-type heavily doped polysilicon structure 220 is in direct contact with the channel portion 330. Partially overlapping the orthographic projection of the second N-type heavily doped polysilicon structure 220 on the substrate 10 with the orthographic projection of the gate electrode 50 on the substrate 10 can ensure that the gate electrode 50 can control the channel portion 330. Even if the gate electrode 50 is offset from the channel portion 330 on a side of the second N-type heavily doped polysilicon structure 220, the orthographic projection of the gate electrode 50 on the substrate 10 can completely cover the orthographic projection of the channel portion 330 on the substrate 10, which avoids the problem that the mobility of the channel portion 330 is reduced due to the offset between the gate electrode 50 and the channel portion 330.

Furthermore, a length of an overlapping portion of the orthographic projection of the second N-type heavily doped polysilicon structure 220 on the substrate 10 and the orthographic projection of the gate electrode 50 on the substrate 10 is greater than 0 μm and less than or equal to 0.5 μm. For example, the length of the overlapping portion of the orthographic projection of the second N-type heavily doped polysilicon structure 220 on the substrate 10 and the orthographic projection of the gate electrode 50 on the substrate 10 may be 0.1 μm, 0.3 μm, or 0.5 μm.

In some other embodiments, the orthographic projection of the second N-type heavily doped polysilicon structure 220 on the substrate 10 does not overlap with the orthographic projection of the gate electrode 50 on the substrate 10. The orthographic projection of the second N-type heavily doped polysilicon structure 220 on the substrate 10 may be adjacent to the orthographic projection of the gate electrode 50 on the substrate 10.

The gate metal layer may be a composite layer formed by stacking two or more metals or alloys. For example, the gate metal layer may be a composite layer formed by stacking copper (Cu) and molybdenum (Mo).

The gate metal layer may have a thickness greater than or equal to 2000 angstroms and less than or equal to 5500 angstroms. For example, the thickness of the gate metal layer may be 2000 angstroms, 2500 angstroms, 3000 angstroms, 3750 angstroms, 4000 angstroms, 4500 angstroms, 5000 angstroms, or 5500 angstroms.

Figure 2G:
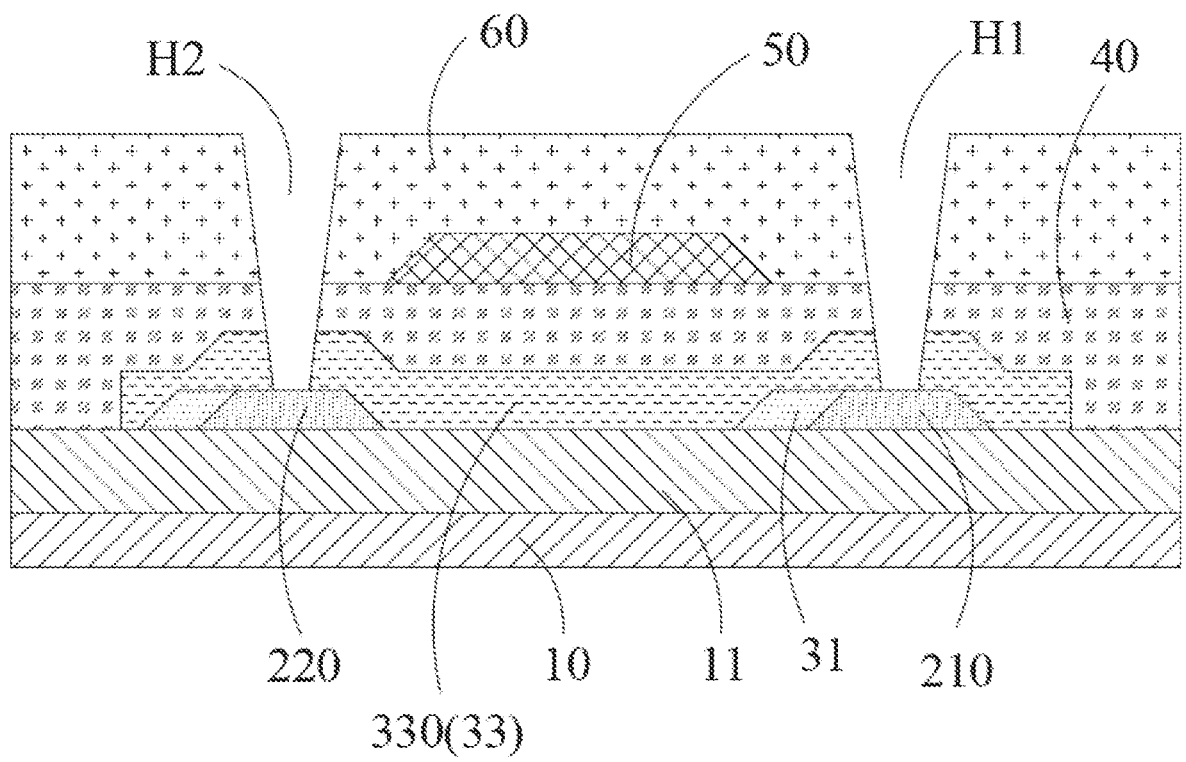

Step S70: please refer to FIG. 2g, forming an interlayer dielectric layer 60 on the gate electrode 50.

Step S80: please refer to FIG. 2g, forming a plurality of via holes penetrating through the interlayer dielectric layer 60, the gate insulating layer 40, and the semiconductor layer 33, and exposing the first N-type heavily doped polysilicon structure 210 and the second N-type heavily doped polysilicon structure 220.

As shown in FIG. 2g, in steps S70 and S80, the interlayer dielectric layer 60 may be formed first by chemical vapor deposition, and then the first via hole H1 and the second via hole H2 are formed by opening holes in the interlayer dielectric layer 60, the gate insulating layer 40, and the semiconductor layer 33 by sequentially using a yellow light process and an etching process. The first via hole H1 penetrates through the interlayer dielectric layer 60, the gate insulating layer 40, and the semiconductor layer 33, and exposes the first N-type heavily doped polysilicon structure 210, but does not penetrate through the first N-type heavily doped polysilicon structure 210. The second via hole H2 penetrates through the interlayer dielectric layer 60, the gate insulating layer 40, and the semiconductor layer 33, and exposes the second N-type heavily doped polysilicon structure 220.

In this embodiment, the interlayer dielectric layer 60 may be a single-layer structure made of silicon oxide, or may be a composite layer formed by stacking silicon nitride and silicon oxide.

Figure 2H:
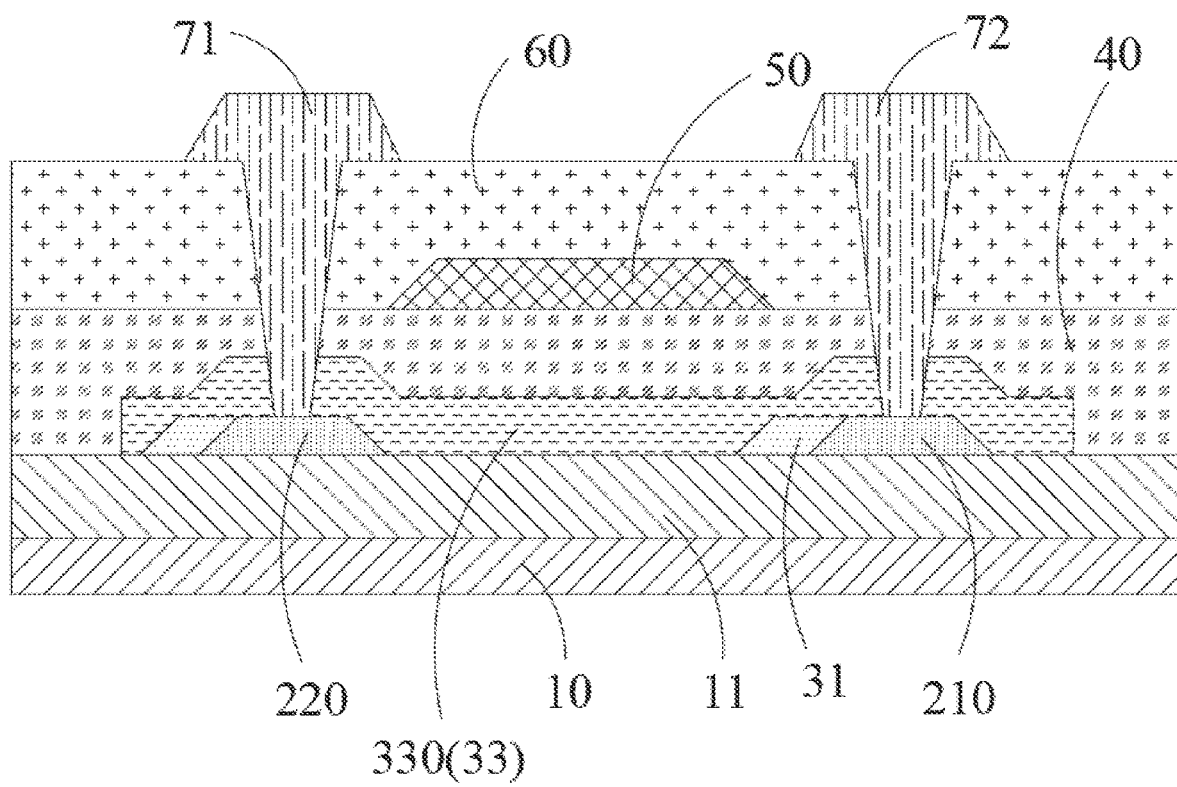

Step S90: please refer to FIG. 2h, forming a source-drain electrode layer on the interlayer dielectric layer 60, and patterning the source-drain electrode layer to form a source electrode 71 and a drain electrode 72, wherein the drain electrode 72 is in contact with the first N-type heavily doped polysilicon structure 210 through one of the via holes, and the source electrode 72 is in contact with the second N-type heavily doped polysilicon structure 220 through another via hole.

As shown in FIG. 2h, a metal material may be deposited on the interlayer dielectric layer 60 and in the first via hole H1 and the second via hole H2 by chemical vapor deposition to form the source-drain electrode layer. Then, the source-drain electrode layer is patterned using the yellow light process and the etching process in sequence to form the source electrode 71 and the drain electrode 72.

The drain electrode 72 extends into the first via hole H1 and is in contact with the first N-type heavily doped polysilicon structure 210. The source electrode 71 extends to the second via hole H2 and is in contact with the second N-type heavily doped polysilicon structure 220.

Figure 2I:
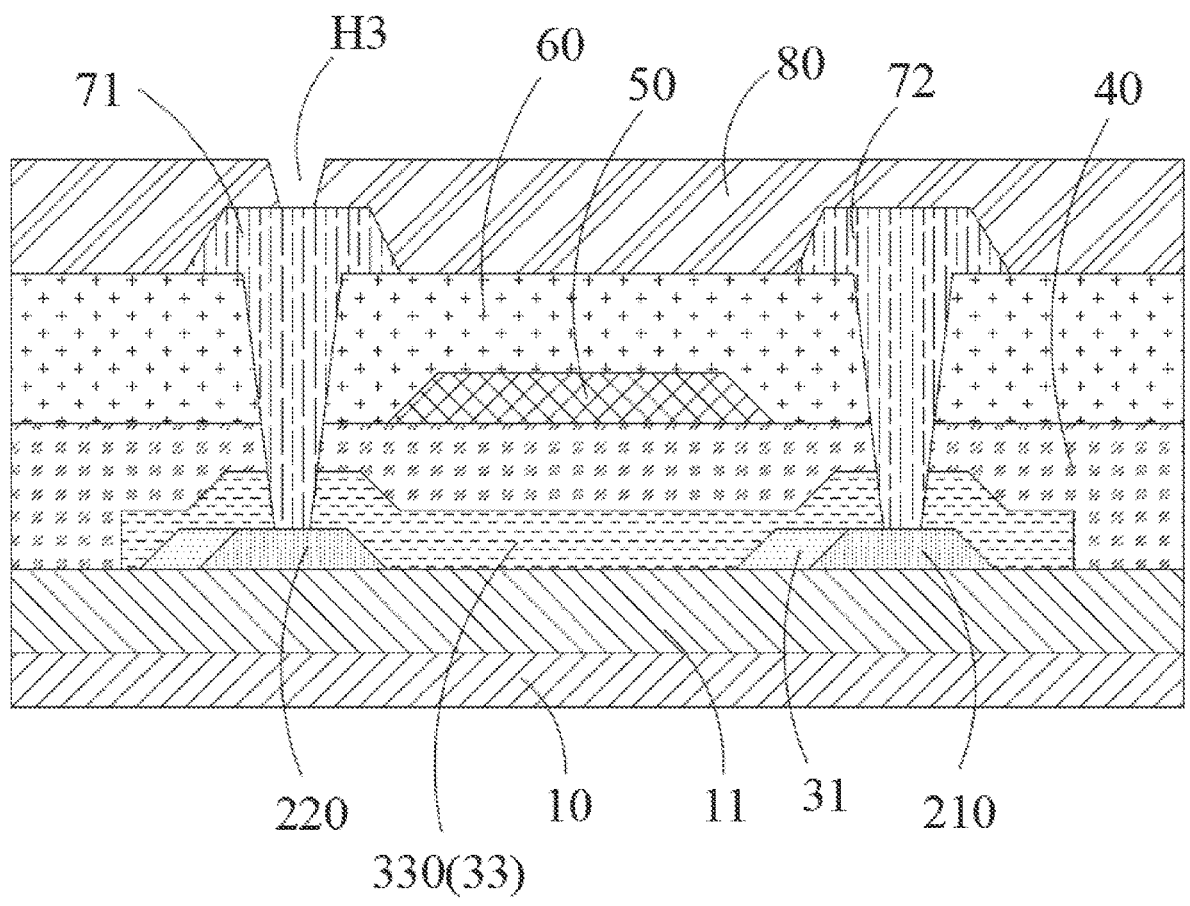
Figure 2J:
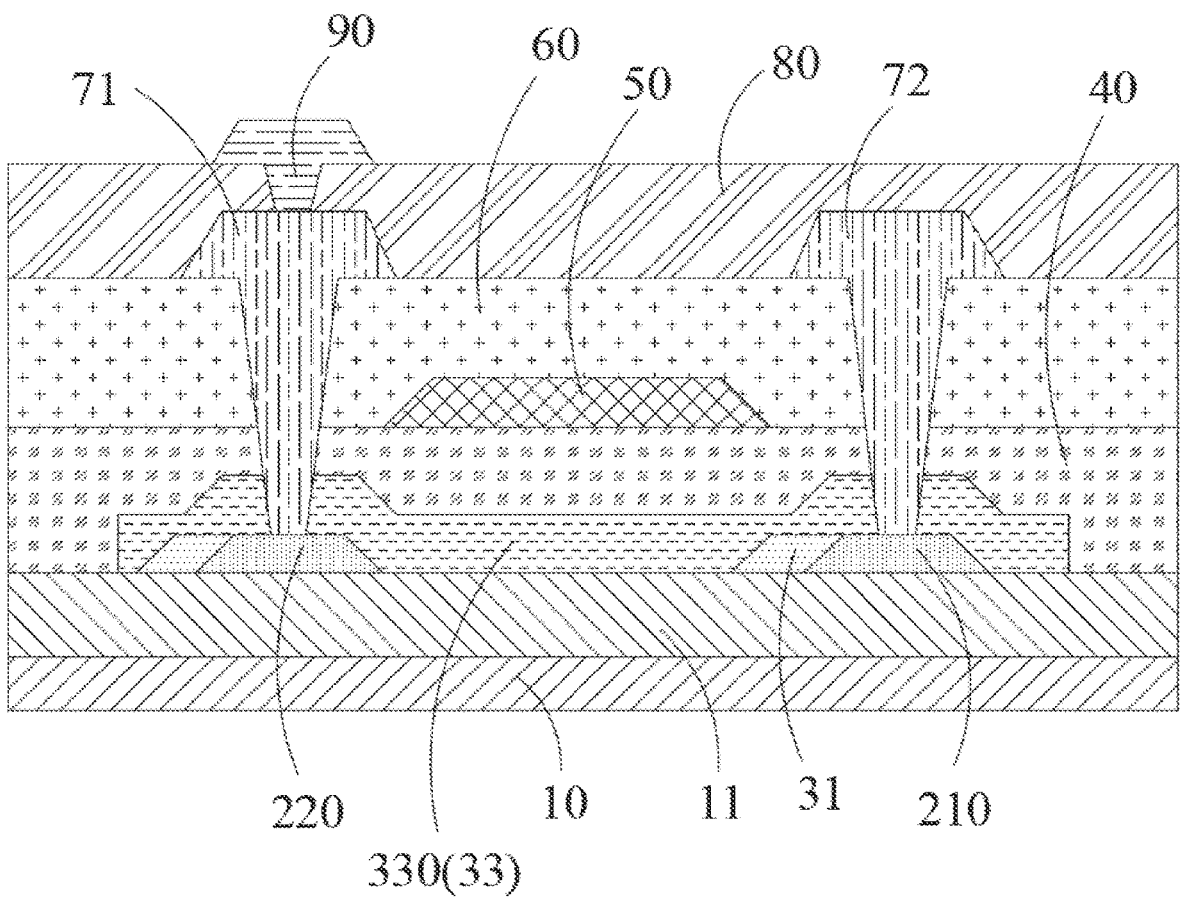

Please refer to FIG. 2i and FIG. 2j, the method for fabricating the display panel further comprises the following steps.

Step S100: please refer to FIG. 2i, forming a protective layer 80 on the source electrode 71 and the drain electrode 72, and forming a bridging hole H3 in the protective layer 80, wherein the bridging hole H3 exposes the source electrode 71.

Step S110: please refer to FIG. 2j, forming an electrode layer 90 on the protective layer 80, wherein the electrode layer 90 is in contact with the source electrode 71 through the tap bridging H3.

In this embodiment, the electrode layer 90 may be made of transparent metal oxide. For example, the transparent metal oxide may be, but is not limited to, indium tin oxide (ITO).

It should be noted that the above are some steps of the method for fabricating the display panel provided by the embodiments of the present disclosure, and other subsequent steps may adopt or refer to current methods, which are not limited herein.

According to the method for fabricating the display panel provided by the above embodiments of the present disclosure, the present disclosure further provides a display panel. The display panel can be formed by using the method for fabricating the display panel provided by the above embodiments.

Figure 4:
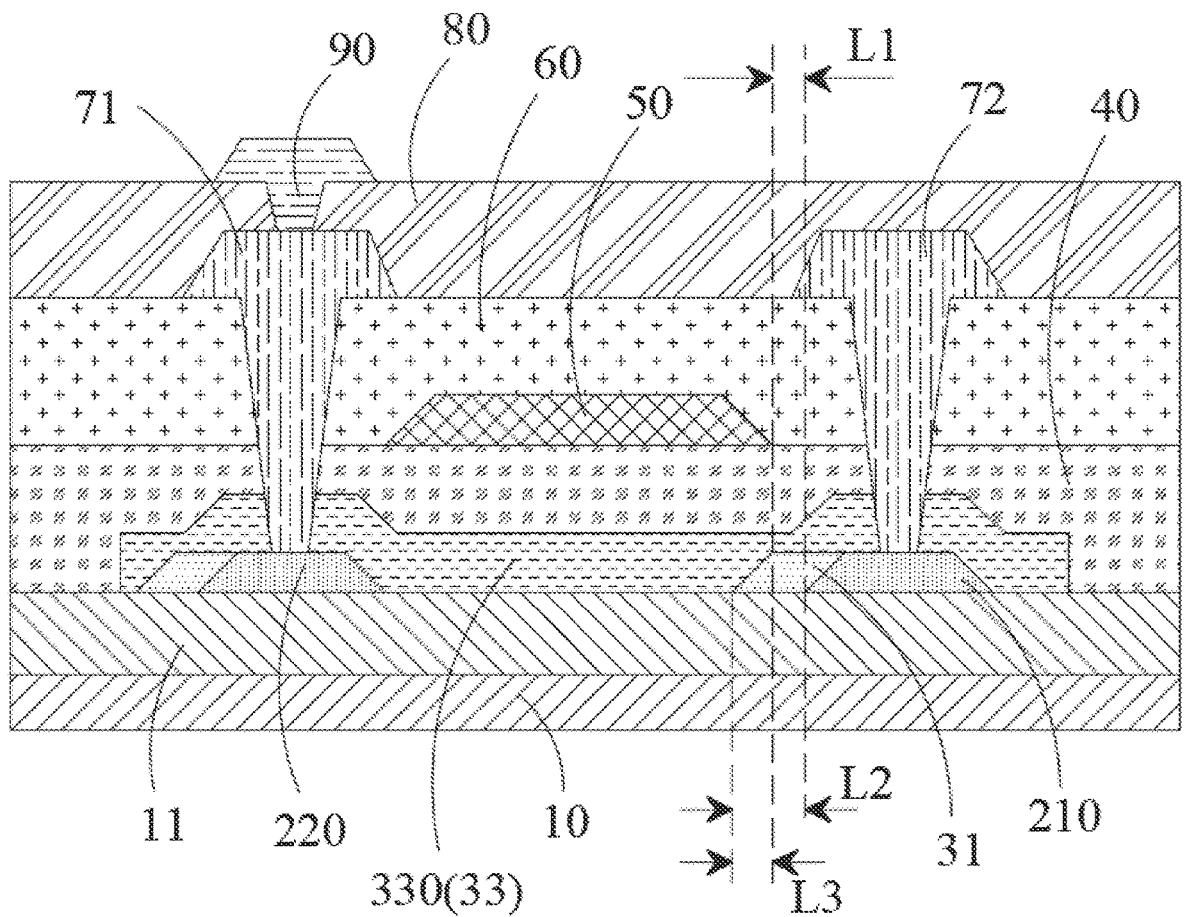
FIG. 4 is a schematic structural diagram of a display panel according to an embodiment of the present disclosure.

Please refer to FIG. 4, which is a schematic structural diagram of a display panel according to an embodiment of the present disclosure. The display panel comprises a substrate 10, a plurality of N-type heavily doped polysilicon structures, an N-type lightly doped polysilicon structure 31, and a semiconductor layer 33.

The N-type heavily doped polysilicon structures are disposed on the substrate 10. The N-type lightly doped polysilicon structure 31 is disposed on the substrate 10, is located between two adjacent N-type heavily doped polysilicon structures, and is in contact with one of the N-type heavily doped polysilicon structures. The semiconductor layer 33 covers the two adjacent N-type heavily doped polysilicon structures and the N-type lightly doped polysilicon structure 31 located between the two adjacent N-type heavily doped polysilicon structures.

Furthermore, the display panel further comprises a source electrode 71 and a drain electrode 72. The N-type heavily doped polysilicon structures comprise a first N-type heavily doped polysilicon structure 210 and a second N-type heavily doped polysilicon structure 220. The drain electrode 72 is electrically connected to the first N-type heavily doped polysilicon structure 210. The source electrode 72 is electrically connected to the second N-type heavily doped polysilicon structure 220.

As shown in FIG. 4, the N-type lightly doped polysilicon structure 31 is disposed on a side of the first N-type heavily doped polysilicon structure 210 close to the second N-type heavily doped polysilicon structure 220 and is in contact with the first N-type heavily doped polysilicon structure 210.

The semiconductor layer 33 comprises a channel portion 330. The channel portion 330 is disposed between the N-type lightly doped polysilicon structure 31 and the second N-type heavily doped polysilicon structure 220, and is in contact with the N-type lightly doped polysilicon structure 31 and the second N-type heavily doped polysilicon structure 220.

The display panel further comprises a gate insulating layer 40, a gate electrode 50, and an interlayer dielectric layer 60 stacked on the semiconductor layer 33. The source electrode 71 and the drain electrode 72 are disposed on a side of the interlayer dielectric layer 60 away from the substrate 10.

The display panel further comprises a plurality of via holes penetrating through the interlayer dielectric layer 60, the gate insulating layer 40, and the semiconductor layer 33, and exposing the first N-type heavily doped polysilicon structure 210 and the second N-type heavily doped polysilicon structure 220. The drain electrode 72 is in contact with the first N-type heavily doped polysilicon structure 210 through one of the via holes, and the source electrode 71 is in contact with the second N-type heavily doped polysilicon structure 210 through another via hole.

In this embodiment, the channel portion 330 is an intrinsic undoped semiconductor, the first N-type heavily doped polysilicon structure 210 and the N-type lightly doped polysilicon structure 31 are both doped with phosphorus ions, and a doping concentration of the N-type lightly doped polysilicon structure 31 is less than a doping concentration of the first N-type heavily doped polysilicon structure 210. Therefore, a resistance of the channel portion 330 is greater than a resistance of the N-type lightly doped polysilicon structure 31, and the resistance of the N-type lightly doped polysilicon structure 31 is greater than a resistance of the first N-type heavily doped polysilicon structure 210. Thus, a resistance from the channel portion 330 to the first N-type heavily doped polysilicon structure 210 is gradually reduced. Because the resistance of the N-type lightly doped polysilicon structure 31 is greater than the resistance of the first N-type heavily doped polysilicon structure 210, adding the N-type lightly doped polysilicon structure 31 between the first N-type heavily doped polysilicon structure 210 and the channel portion 330 increases a resistance between the source electrode and the drain electrode. In this way, a leakage current flowing from the source electrode to the drain electrode is reduced, thereby improving the problem that a polysilicon thin film transistor has a leakage current in an off state and increasing a stability of the polysilicon thin film transistor.

Furthermore, as shown in FIG. 4, the orthographic projection of the gate electrode 50 on the substrate 10 covers the orthographic projection of the channel portion 330 on the substrate 10. The orthographic projection of the gate electrode 50 on the substrate 10 does not overlap with the orthographic projection of the first N-type heavily doped polysilicon structure 210 on the substrate 10. The orthographic projection of the gate electrode 50 on the substrate 10 partially overlaps an orthographic projection of the N-type lightly doped polysilicon structure 31 on the substrate 10.

It should be noted that when forming the first N-type heavily doped polysilicon structure 210 and the second N-type heavily doped polysilicon structure 220, the first N-type heavily doped polysilicon structure 210 and the second N-type heavily doped polysilicon structure 220 have been doped with phosphorus ions. Therefore, the first N-type heavily doped polysilicon structure 210, the second N-type heavily doped polysilicon structure 220, and the N-type lightly doped polysilicon structure 31 need not be doped with shielding of the gate electrode 50 at the channel portion 330. Due to limitation of process accuracy, it is impossible to accurately control the orthographic projection of the gate electrode 50 on the substrate 10 to cover the orthographic projection of the channel portion 330 on the substrate 10, so the gate electrode 50 may be offset from the channel portion 330. If the gate electrode 50 and the channel portion 330 are offset, when the gate electrode 50 receives a signal, an region of the channel portion 330 not covered by the gate electrode 50 may not be controlled by the gate electrode 50, and a resistance of the region is greater than a resistance of a region of the channel portion 330 covered by the gate electrode 50, so that a mobility of the channel portion 330 is reduced.

By making the orthographic projection of the gate electrode 50 on the substrate 10 partially overlap with the orthographic projection of the N-type lightly doped polysilicon structure 31 on the substrate 10, even if the gate electrode 50 is offset from the channel portion 330, the orthographic projection of the gate electrode 50 on the substrate 10 can completely cover the orthographic projection of the channel portion 330 on the substrate 10. This ensures that the gate electrode 50 can control the channel portion 330, and avoids a problem that the mobility of the channel portion 330 is reduced due to the offset between the gate electrode 50 and the channel portion 330.

Furthermore, a distance L1 between the orthographic projection of the first N-type heavily doped polysilicon structure 210 on the substrate 10 and the orthographic projection of the gate electrode 50 on the substrate 10 is 1 μm to 3 μm, a length L2 of the N-type lightly doped polysilicon structure 31 is 1 μm to 4 μm, and a length L3 of an overlapping portion of the orthographic projection of the N-type lightly doped polysilicon structure 31 on the substrate 10 and the orthographic projection of the gate electrode 50 on the substrate 10 is greater than 0 μm and less than or equal to 1 μm.

In an embodiment, the distance L1 between the orthographic projection of the first N-type heavily doped polysilicon structure 210 on the substrate 10 and the orthographic projection of the gate electrode 50 on the substrate 10 is 1 μm, the length L2 of the N-type lightly doped polysilicon structure 31 is 1.1 µm, and the length L3 of the overlapping portion of the orthographic projection of the N-type lightly doped polysilicon structure 31 on the substrate 10 and the orthographic projection of the gate electrode 50 on the substrate 10 is 0.1 µm.

In an embodiment, the distance L1 between the orthographic projection of the first N-type heavily doped polysilicon structure 210 on the substrate 10 and the orthographic projection of the gate electrode 50 on the substrate 10 is 1.5 µm, the length L2 of the N-type lightly doped polysilicon structure 31 is 2 µm, and the length L3 of the overlapping portion of the orthographic projection of the N-type lightly doped polysilicon structure 31 on the substrate 10 and the orthographic projection of the gate electrode 50 on the substrate 10 is 0.5 µm.

In an embodiment, the distance L1 between the orthographic projection of the first N-type heavily doped polysilicon structure 210 on the substrate 10 and the orthographic projection of the gate electrode 50 on the substrate 10 is 3 µm, the length L2 of the N-type lightly doped polysilicon structure 31 is 4 µm, and the length L3 of the overlapping portion of the orthographic projection of the N-type lightly doped polysilicon structure 31 on the substrate 10 and the orthographic projection of the gate electrode 50 on the substrate 10 is 1 µm.

It should be noted that in order to ensure the gate electrode 50 can control the channel portion 330, the length L3 of the overlapping portion of the orthographic projection of the N-type lightly doped polysilicon structure 31 on the substrate 10 and the orthographic projection of the gate electrode 50 on the substrate 10 should be greater than 0 µm, and the length L3 of the overlapping portion of the orthographic projection of the N-type lightly doped polysilicon structure 31 on the substrate 10 and the orthographic projection of the gate electrode 50 on the substrate 10 should not be greater than 1 µm. In this way, it can be avoided that the N-type lightly doped polysilicon structure 31 compresses the length of the channel portion 330, thereby preventing the leakage current from increasing due to a short channel effect being exacerbated because a channel length of the channel portion 330 is too short.

In an embodiment, an orthographic projection of the second N-type heavily doped polysilicon structure 220 on the substrate 10 partially overlaps the orthographic projection of the gate electrode 50 on the substrate 10.

It should be noted that there is no lightly doped structure between the second N-type heavily doped polysilicon structure 220 and the channel portion 330, and the second N-type heavily doped polysilicon structure 220 is in direct contact with the channel portion 330. Partially overlapping the orthographic projection of the second N-type heavily doped polysilicon structure 220 on the substrate 10 with the orthographic projection of the gate electrode 50 on the substrate 10 can ensure that the gate electrode 50 can control the channel portion 330. Even if the gate electrode 50 is offset from the channel portion 330 on a side of the second N-type heavily doped polysilicon structure 220, the orthographic projection of the gate electrode 50 on the substrate 10 can completely cover the orthographic projection of the channel portion 330 on the substrate 10, which avoids the problem that the mobility of the channel portion 330 is reduced due to the offset between the gate electrode 50 and the channel portion 330.

Furthermore, a length of an overlapping portion of the orthographic projection of the second N-type heavily doped polysilicon structure 220 on the substrate 10 and the orthographic projection of the gate electrode 50 on the substrate 10 is greater than 0 µm and less than or equal to 0.5 µm. For example, the length of the overlapping portion of the orthographic projection of the second N-type heavily doped polysilicon structure 220 on the substrate 10 and the orthographic projection of the gate electrode 50 on the substrate 10 may be 0.1 µm, 0.3 µm, or 0.5 µm.

In some other embodiments, the orthographic projection of the second N-type heavily doped polysilicon structure 220 on the substrate 10 does not overlap with the orthographic projection of the gate electrode 50 on the substrate 10. The orthographic projection of the second N-type heavily doped polysilicon structure 220 on the substrate 10 may be adjacent to the orthographic projection of the gate electrode 50 on the substrate 10.

Beneficial effects of the present disclosure are as follows. The present disclosure provides a display panel and a method for fabricating the same. The method comprises: forming a plurality of N-type doped amorphous silicon structures on a substrate; forming an amorphous silicon layer covering the N-type doped amorphous silicon structures and the substrate; blue laser annealing the amorphous silicon layer and the N-type doped amorphous silicon structures, so that the N-type doped amorphous silicon structures are converted into N-type heavily doped polysilicon structures, a part of the amorphous silicon layer in contact with one of the N-type doped amorphous silicon structures and located between two adjacent N-type doped amorphous silicon structures is converted into an N-type lightly doped polysilicon structure, and other parts of the amorphous silicon layer are converted into a polysilicon layer; and patterning the polysilicon layer to form a semiconductor layer. In this way, the problem that a polysilicon thin film transistor has a leakage current in an off state is improved, and a stability of the polysilicon thin film transistor is increased.

The present invention has been described in the above preferred embodiments, but the preferred embodiments are not intended to limit the present invention. Those skilled in the art may make various changes and modifications without departing from the scope of the present invention. The scope of the present invention is determined by claims.

What is claimed is:

1. A method for fabricating a display panel, comprising:
forming a plurality of N-type doped amorphous silicon structures on a substrate;
forming an amorphous silicon layer covering the N-type doped amorphous silicon structures and the substrate;
blue laser annealing the amorphous silicon layer and the N-type doped amorphous silicon structures, so that the N-type doped amorphous silicon structures are converted into N-type heavily doped polysilicon structures, a part of the amorphous silicon layer in contact with one of the N-type doped amorphous silicon structures and located between two adjacent N-type doped amorphous silicon structures is converted into an N-type lightly doped polysilicon structure, and other parts of the amorphous silicon layer are converted into a polysilicon layer; and
patterning the polysilicon layer to form a semiconductor layer.

2. The method for fabricating the display panel according to claim 1, wherein the N-type doped amorphous silicon structures comprise a first N-type doped amorphous silicon structure and a second N-type doped amorphous silicon structure, and in the blue laser annealing the amorphous silicon layer and the N-type doped amorphous silicon structures, a laser scanning direction is a direction from the first N-type doped amorphous silicon structure to the second N-type doped amorphous silicon structure.

3. The method for fabricating the display panel according to claim 2, wherein a part of the amorphous silicon layer located on a side of the first N-type doped amorphous silicon structure close to the second N-type doped amorphous silicon structure and in contact with the first N-type doped amorphous silicon structure is converted into the N-type lightly doped polysilicon structure.

4. The method for fabricating the display panel according to claim 3, wherein the first N-doped amorphous silicon structure is converted into a first N-type heavily doped polysilicon structure, the second N-type doped amorphous silicon structure is converted into a second N-type doped polysilicon structure, the semiconductor layer comprises a channel portion located between the N-type lightly doped polysilicon structure and the second N-type heavily doped polysilicon structure, and the channel portion is in contact with the N-type lightly doped polysilicon structure and the second N-type heavily doped polysilicon structure.

5. The method for fabricating the display panel according to claim 3, further comprising:
    forming a gate insulating layer on the semiconductor layer;
    forming a gate metal layer on the gate insulating layer, and patterning the gate metal layer to form a gate electrode;
    forming an interlayer dielectric layer on the gate electrode;
    forming a plurality of via holes penetrating through the interlayer dielectric layer, the gate insulating layer, and the semiconductor layer, and exposing the first N-type heavily doped polysilicon structure and the second N-type heavily doped polysilicon structure; and
    forming a source-drain electrode layer on the interlayer dielectric layer, and patterning the source-drain electrode layer to form a source electrode and a drain electrode, wherein the drain electrode is in contact with the first N-type heavily doped polysilicon structure through one of the via holes, and the source electrode is in contact with the second N-type heavily doped polysilicon structure through another via hole.

6. The method for fabricating the display panel according to claim 5, wherein an orthographic projection of the first N-type heavily doped polysilicon structure on the substrate does not overlap with an orthographic projection of the gate electrode on the substrate, and an orthographic projection of the N-type lightly doped polysilicon structure on the substrate partially overlaps the orthographic projection of the gate electrode on the substrate.

7. The method for fabricating the display panel according to claim 6, wherein a distance between the orthographic projection of the first N-type heavily doped polysilicon structure on the substrate and the orthographic projection of the gate electrode on the substrate is 1 μm to 3 μm, a length of the N-type lightly doped polysilicon structure is 1 μm to 4 μm, and a length of an overlapping portion of the orthographic projection of the N-type lightly doped polysilicon structure on the substrate and the orthographic projection of the gate electrode on the substrate is greater than 0 μm and less than or equal to 1 μm.

8. The method for fabricating the display panel according to claim 1, wherein each of the N-type doped amorphous silicon structures has an inclined sidewall and a bottom surface connected to the inclined sidewall and lying flat on the substrate, and an angle between the inclined sidewall and the bottom surface is less than 45°.

9. The method for fabricating the display panel according to claim 8, wherein a length of an orthographic projection of the inclined sidewall on the bottom surface is greater than or equal to 0.5 μm and less than or equal to 2 μm.

10. The method for fabricating the display panel according to claim 1, wherein in the blue laser annealing the amorphous silicon layer and the N-type doped amorphous silicon structures, crystallization energy is greater than or equal to 700 mA and less than or equal to 1200 mA.

* * * * *